(12) United States Patent
Usami

(10) Patent No.: US 8,492,783 B2
(45) Date of Patent: Jul. 23, 2013

(54) LIGHT-EMITTING DEVICE, PRODUCTION METHOD THEREFOR, AND DISPLAY CONTAINING THE SAME

(75) Inventor: Yoshihisa Usami, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 78 days.

(21) Appl. No.: 13/120,139

(22) PCT Filed: Sep. 2, 2009

(86) PCT No.: PCT/JP2009/065620
§ 371 (c)(1),
(2), (4) Date: Mar. 21, 2011

(87) PCT Pub. No.: WO2010/032652
PCT Pub. Date: Mar. 25, 2010

(65) Prior Publication Data
US 2011/0175116 A1 Jul. 21, 2011

(30) Foreign Application Priority Data
Sep. 22, 2008 (JP) ................... 2008-243318

(51) Int. Cl.
*H01L 33/44* (2010.01)
(52) U.S. Cl.
USPC .............................. 257/98; 438/39
(58) Field of Classification Search
USPC ....... 257/79, 98, E33.005, E33.067, E33.074; 438/22, 29, 39, 42
See application file for complete search history.

(56) References Cited

U.S. PATENT DOCUMENTS

| 6,476,550 B1 | 11/2002 | Oda et al. | |
| 2001/0043627 A1* | 11/2001 | Koyama et al. | 372/39 |
| 2002/0061418 A1 | 5/2002 | Imanishi | |
| 2005/0127375 A1* | 6/2005 | Erchak et al. | 257/79 |

(Continued)

FOREIGN PATENT DOCUMENTS

| JP | 2991183 B2 | 12/1999 |
| JP | 2006-294491 A | 10/2006 |

(Continued)

OTHER PUBLICATIONS

Sano et al., "An Organic Light-Emitting Diode with Highly Efficient Light Extraction Using Newly Developed Diffraction Layer", SID Symposium Digest (May 2008): pp. 515-517.*

(Continued)

*Primary Examiner* — Hsien Ming Lee
*Assistant Examiner* — Michele Fan
(74) *Attorney, Agent, or Firm* — Morgan, Lewis & Bockius, LLP

(57) ABSTRACT

The present invention provides a light-emitting device which includes, in the order mentioned, a light-emitting layer containing a light-emitting portion, an intermediate layer, and a fine concavo-convex pattern, wherein the intermediate layer is disposed over a second surface of the light-emitting layer which surface is opposite to a first surface of the light-emitting layer, wherein the fine concavo-convex pattern has a cross-sectional shape which has portions projected and recessed with respect to the light-emitting layer, and reflects light emitted from the light-emitting layer, and wherein at least part of the intermediate layer has a refractive index of 0.9n to 1.1n, where n denotes a refractive index of the light-emitting portion with respect to light which has a main light-emitting wavelength.

16 Claims, 3 Drawing Sheets

U.S. PATENT DOCUMENTS

| | | | |
|---|---|---|---|
| 2005/0194608 A1* | 9/2005 | Chen | 257/100 |
| 2006/0055319 A1 | 3/2006 | Uemura et al. | |
| 2006/0062270 A1 | 3/2006 | Okutani et al. | |
| 2007/0102711 A1* | 5/2007 | Aoyagi et al. | 257/79 |
| 2007/0176196 A1* | 8/2007 | Kim et al. | 257/99 |
| 2007/0205417 A1* | 9/2007 | Ohara et al. | 257/79 |
| 2008/0149916 A1* | 6/2008 | Baba et al. | 257/13 |
| 2008/0173887 A1* | 7/2008 | Baba et al. | 257/98 |
| 2009/0021151 A1* | 1/2009 | Fukuda | 313/504 |
| 2009/0072708 A1* | 3/2009 | Tamaki et al. | 313/503 |

FOREIGN PATENT DOCUMENTS

| | | |
|---|---|---|
| JP | 2008-66027 A | 3/2008 |
| WO | WO 02/37568 A1 | 5/2002 |
| WO | WO 2005/017860 A1 | 2/2005 |
| WO | WO 2005/017861 A1 | 2/2005 |

OTHER PUBLICATIONS

Kamiura et al., "Studies on OLED Light Extraction Enhancement—Light Emission Analysis and Device Investigation", IEICE Technical Report, EID2007-102, OME2007-84, pp. 1-4, Mar. 2008.

Sano et al., "36.3: An Organic Light-Emitting Diode with Highly Efficient Light Extraction Using Newly Developed Diffraction Layer", SID 08 Digest, pp. 515-517, 2008.

Wedge et al., "Surface plasmon-polariton mediated emission of light from top-emitting organic light-emitting diode type structures", Organic Electronics, vol. 8, 2007, pp. 136-147, XP005933426.

* cited by examiner

LIGHT-EMITTING DEVICE, PRODUCTION METHOD THEREFOR, AND DISPLAY CONTAINING THE SAME

TECHNICAL FIELD

The present invention relates to a light-emitting device, a production method therefore and a display containing the light-emitting device, more specifically, to light-emitting devices such as an organic electroluminescence device (organic EL device), an inorganic electroluminescence device (inorganic EL device) and a light emitting diode (LED), a production method therefore, and a display containing the light-emitting device.

BACKGROUND ART

For example, in an organic EL device 105 as shown in FIG. 3, light beams, which have been emitted from an EL light-emitting layer 102 laid on a reflective layer 101, are reflected on the interface between the EL light-emitting layer 102 and a seal layer 103 or between the seal layer 103 and the outside 104, leading to decrease in light-extraction efficiency.

Here, regarding the reflectivity of light on the interface at which refraction of the light occurs, when the interface is flat, the reflectivity depends on the incident angle of the light and the difference in refractive index between media which share the interface. For example, when the difference in refractive index therebetween is large, the reflectivity on the interface becomes high. Also, when light travels from the medium having a high refractive index to that having a low refractive index at an incident angle larger than the critical angle, 100% of the light is reflected.

Critical angle $\theta_c$ is the minimum incident angle of light at which the light is totally reflected when it travels from a substance having a high refractive index to that having a low refractive index, and expressed by the equation: $\theta_c = \arcsin(n_2/n_1)$, where $n_1$ denotes a refractive index of a substance through which light travels; $n_2$ denotes a refractive index of a substance light enters; and $n_2 < n_1$.

FIG. 4 is an explanatory view used for describing the above phenomenon. In this figure, reference numerals 111 and 112 respectively denote a first layer having a refractive index $n_1$ and a second layer having a refractive index $n_2$. Here, when light travels at an incident angle of critical angle $\theta_c$ with respect to a normal line (standard line) to the interface 110 between the first and second layers, the light is totally reflected on the interface 110 and thus, cannot be extracted from the second layer 112. In addition, light traveling at an incident angle of $\theta_x$ greater than critical angle $\theta_c$ with respect to the standard line is also totally reflected on the interface 110 and thus, cannot be extracted from the second layer 112.

Meanwhile, light traveling at an incident angle of $\theta_y$ smaller than critical angle $\theta_c$ with respect to the standard line transmits the interface 110 to be emitted from the second layer 112 to the first layer 111.

Light-emitting devices in which light is totally reflected when being emitted from a high-refractive-index medium to a low-refractive-index medium pose a problem in that the light-extraction efficiency is low.

In view of this, there have been proposed light-emitting devices having various structures, with which the light-extraction efficiency is attempted to be improved.

One proposed light-emitting device is an organic electroluminescence device including an anode, a cathode, one or more organic layers containing a light-emitting layer disposed between the electrodes and a diffracting grating or a zone plate, wherein the diffracting grating or the zone plate is disposed in position for preventing total reflection on the interface in the device (see Patent Literature 1).

Nevertheless, in the light-emitting device disclosed in Patent Literature 1, light emitted passes through low-refractive-index layers to reach the diffracting grating or zone plate and thus, limitation is imposed on prevention of total reflection.

Also, another proposed light-emitting device contains a concavo-convex patterned scattering layer at a back surface opposite to a light-emitting surface, wherein the scattering layer reflects/scatters light emitted through an intermediate layer from a light-emitting layer toward the light-emitting surface for light extraction (see Non-Patent Literatures 1 and 2).

One conventionally known light-emitting device, as shown in FIG. 5, includes a light-emitting layer 202 containing a light-emitting portion 204; an intermediate layer 205; and a fine concavo-convex pattern 206 in this order, wherein the intermediate layer and the fine concavo-convex pattern are laid over a second surface 203B of the light-emitting layer 202 which surface is opposite to a first surface 203A thereof.

However, such conventional light-emitting device has a light-emitting layer and an intermediate layer which are different in refractive index (for example, the refractive index n of the light-emitting layer: 1.8, and the refractive index n of the intermediate layer: 1.5) and thus, poses a problem in that the light-extraction efficiency from the light-emitting layer 202 is low due to total reflection.

Specifically, light beam 210a which is emitted from the light-emitting portion 204 to the second surface 203B of the light-emitting layer 202 and whose incident angle is $\theta_x$ greater than critical angle $\theta_c$ is totally reflected on the second surface 203, and cannot be extracted from the light-emitting portion 204.

Also, light beam 210b which is totally reflected on the interface between the light-emitting portion 204 and a seal layer 207 toward the second surface 203B and whose incident angle is $\theta_x$ greater than critical angle $\theta_c$ is totally reflected on the second surface 203B, and cannot be extracted from the light-emitting portion 204.

Furthermore, light beam 210c which is totally reflected on the first surface 203A of the light-emitting layer 202 toward the second surface 203B and whose incident angle is $\theta_x$ greater than critical angle $\theta_c$ is totally reflected on the second surface 203B, and cannot be extracted from the light-emitting portion 204.

In view of the above, demand has arisen for a light-emitting device which is improved in light-extraction efficiency.

CITATION LIST

Patent Literature

PTL 1: Japanese Patent No. 2991183

Non Patent Literature

NPL 1: Norihiko Kamiura, four others "Studies on OLED Light Extraction Enhancement" edited by THE INSTITUTE OF ELECTRONICS, INFORMATION AND COMMUNICATION ENGINEERS, TECHNICAL REPORT OF IEICE, EID2007-102, OME2007-84 (2008-03), pp. 1 to 4

NPL 2: Hiroshi Sano, 12 others "An Organic Light-Emitting Diode with Highly Efficient Light Extraction Using Newly Developed Diffraction Layer," SID 08 DIGEST pp. 515 to 517

SUMMARY OF INVENTION

An object of the present invention is to provide a light-emitting device which is improved in light-extraction efficiency; and a production method for the light-emitting device; and a display containing the light-emitting device. These can solve the above existing problems.

Means for solving the above problems are as follows.

<1> A light-emitting device including, in the order mentioned:

a light-emitting layer containing a light-emitting portion, an intermediate layer, and
a fine concavo-convex pattern,
wherein the intermediate layer is disposed over a second surface of the light-emitting layer which surface is opposite to a first surface of the light-emitting layer,
wherein the fine concavo-convex pattern has a cross-sectional shape which has portions projected and recessed with respect to the light-emitting layer, and reflects light emitted from the light-emitting layer, and
wherein at least part of the intermediate layer has a refractive index of 0.9n to 1.1n, where n denotes a refractive index of the light-emitting portion with respect to light which has a main light-emitting wavelength.

<2> The light-emitting device according to <1> above, wherein the fine concavo-convex pattern has a pitch interval of $0.01\lambda$ to $100\lambda$ where $\lambda$ denotes a main light-emitting wavelength of light emitted from the light-emitting layer.

<3> The light-emitting device according to any one of <1> and <2> above, wherein the light-emitting layer contains two or more of the light-emitting portion.

<4> The light-emitting device according to any one of <1> to <3> above, wherein the fine concavo-convex pattern is made of heat-mode resist.

<5> The light-emitting device according to any one of <1> to <4> above, wherein the fine concavo-convex pattern includes a reflective layer.

<6> The light-emitting device according to <5> above, wherein the reflective layer has a thickness of 10 nm to 10,000 nm.

<7> The light-emitting device according to any one of <1> to <6> above, wherein the intermediate layer has a refractive index of 1.55 to 3.0.

<8> The light-emitting device according to any one of <1> to <7> above, wherein the fine concavo-convex pattern has a pitch interval of 50 nm to 10 μm.

<9> The light-emitting device according to any one of <1> to <8> above, wherein the light-emitting layer further includes a seal layer for sealing the light-emitting portion, and wherein a material of the seal layer is any of an acrylic resin, an epoxy resin, a fluorine-containing resin, a silicone resin, a rubber resin and an ester resin.

<10> A production method for the light-emitting device according to any one of <1> to <5> above, including:

forming a light-emitting layer containing a light-emitting portion,
forming an intermediate layer over a second surface of the light-emitting layer which surface is opposite to a first surface of the light-emitting layer, and
forming, over the intermediate layer, a fine concavo-convex pattern having a cross-sectional shape which has portions projected and recessed with respect to the light-emitting layer, the fine concavo-convex pattern reflecting light emitted from the light-emitting layer,
wherein the fine concavo-convex pattern is formed through heat-mode lithography.

<11> A display including:
the light-emitting device according to <1> to <5> above.

The present invention can provide a light-emitting device which is improved in light-extraction efficiency; and a production method for the light-emitting device; and a display containing the light-emitting device, which can solve the above existing problems.

DESCRIPTION OF EMBODIMENTS

Next will be described in detail a light-emitting device of the present invention, a production method for the light-emitting device, and a display containing the light-emitting device.

(Light-Emitting Device)

A light-emitting device of the present invention includes a light-emitting layer containing a light-emitting portion; an intermediate layer; and a fine concavo-convex pattern in this order. The fine concavo-convex pattern reflects light emitted from the light-emitting layer and has a cross-sectional shape which has portions projected and recessed with respect to the light-emitting layer.

Figure 1:
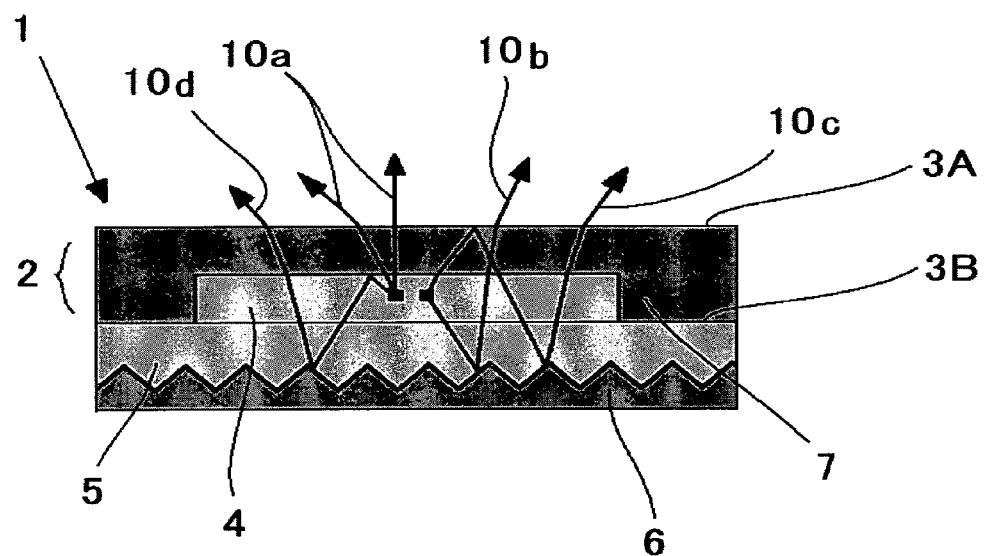
FIG. 1 is a cross-sectional view of an organic EL device as a light-emitting device of the present invention.

FIG. 1 is a schematic view of the structure of such a light-emitting device of the present invention. In this figure, an intermediate layer 5 and a fine concavo-convex pattern 6 are disposed in this order over a second surface 3B of a light-emitting layer 2 which surface is opposite to a first surface 3A (light-emitting surface).

<Light-Emitting Layer>

The light-emitting layer 2 includes a light-emitting portion 4.

The device for the light-emitting portion 4 is not particularly limited and may be appropriately selected depending on the purpose. The light-emitting portion may be, for example, an organic EL device, an inorganic EL device, an LED and a photodiode.

<<Seal Layer>>

In the light-emitting layer 2, the light-emitting portion 4 is sealed with a seal layer 7.

The seal layer 7 prevents the light-emitting portion 4 from degrading in performance due to oxygen and moisture as a result of exposure to air.

Also, the light-emitting layer 2 may contain a moisture absorbent or an inert liquid. The moisture absorbent is not particularly limited, and specific examples thereof include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieve, zeolite and magnesium oxide. Also, the inert liquid is not particularly limited, and specific examples thereof include paraffins; liquid paraffins; fluorine-based solvents such as perfluoroalkanes, perfluoroamines and perfluoroethers; chlorinated solvents; and silicone oils.

The material for the seal layer 7 is not particularly limited, and examples thereof include acrylic resins, epoxy resins, fluorine-containing resins, silicone resins, rubber resins and ester resins. Among them, epoxy resins are preferred from the viewpoint of preventing water permeation. Among the epoxy resins, thermosetting epoxy resins and photo-curable epoxy resins are preferred.

The forming method for the seal layer 7 is not particularly limited, and examples thereof includes a method by coating a resin solution, a method by press-bonding or hot press-bonding a resin sheet, and a method by polymerizing under dry conditions (e.g., vapor deposition and sputtering).

The thickness of the seal layer 7 is preferably 1 μm to 1 mm, more preferably 5 μm to 100 μm, most preferably 10 μm to 50 μm. When the thickness is smaller than 1 μm, the inorganic film may be damaged upon mounting of the substrate. Whereas when the thickness is greater than 1 mm, the light-emitting layer 2 becomes disadvantageously thick.

The light-emitting layer 2 may contain a sealing adhesive having the function of preventing permeation of moisture or oxygen from the edges thereof.

The material for the sealing adhesive may be those used in the seal layer 7. Among them, epoxy resins are preferred from the viewpoint of preventing water permeation. Among the epoxy resins, photo-curable epoxy resins and thermosetting epoxy resins are preferred.

Also, a filler is preferably added to the above materials.

The filler to be incorporated into the seal layer 7 is preferably inorganic materials such as $SiO_2$, SiO (silicon oxide), SiON (silicon oxynitride) and SiN (silicon nitride). The addition of the filler increases the viscosity of the sealant to improve production suitability and humidity resistance.

The sealing adhesive may also contain a desiccant. The desiccant is preferably barium oxide, calcium oxide or strontium oxide.

The amount of the desiccant added to the sealing adhesive is preferably 0.01% by mass to 20% by mass, more preferably 0.05% by mass to 15% by mass. When the amount is less than 0.01% by mass, the desiccant exhibits reduced effects. Whereas when the amount is more than 20% by mass, it is difficult to homogeneously disperse the desiccant in the sealing adhesive, which is not preferred.

In the present invention, the sealing adhesive containing the desiccant is applied in a predetermined amount using, for example, a dispenser. Thereafter, a second substrate is overlaid, followed by curing, to thereby obtain a functional device.

With respect to light having a main light-emitting wavelength λ (for example, 550 nm, the same applies hereinafter), the refractive index $n_1$ of the medium (seal layer 7) of the light-emitting layer 2 is about 1.5, the refractive index $n_2$ of air is about 1.0, and the refractive index $n_3$ of the light-emitting portion 4 is about 1.8.

Here, in the present invention, total reflection occurring on the second surface 3B of the light-emitting layer 2 due to the difference between the refractive index $n_3$ of the light-emitting portion 4 and the refractive index $n_4$ of the intermediate layer 5 is considered, and the refractive indices of them are not limited to the above values.

Notably, the main light-emitting wavelength refers to a peak wavelength.

The forming method for the light-emitting layer 2 is not particularly limited and may be appropriately selected depending on the purpose. For example, the light-emitting layer can be formed by sequentially forming the light-emitting portion 4 and the seal layer 7 with a vacuum film-forming method (e.g., vapor deposition).

<Intermediate Layer>

The refractive index $n_4$ of the intermediate layer 5 is $0.9n_3$ (minimum value) to $1.1n_3$ (maximum value), where $n_3$ denotes a refractive index of the light-emitting portion 4 with respect to light having a main light-emitting wavelength.

When the refractive index $n_4$ of the intermediate layer 5 is $0.9n_3$ to $1.1n_3$, the light-emitting portion 4 has almost the same refractive index as the intermediate layer 5. Thus, the light-emitting portion 4 and the intermediate layer 5 optically substantially function as one layer, avoiding total reflection on the second surface 3B of the light-emitting layer; i.e., the interface between the light-emitting portion 4 and the intermediate layer 5. As a result, light traveling toward the second surface of the light-emitting layer 2 can enter the fine concavo-convex pattern 6.

Preferably, the refractive index $n_4$ of the intermediate layer 5 is $0.95n_3$ (minimum value) to $1.05n_3$ (maximum value).

The material for the intermediate layer 5 is not particularly limited and may be appropriately selected depending on the purpose. Examples thereof include those having a light absorption peak wavelength (e.g., dyes). When such materials are used, there can be employed light whose wavelength is longer than their light absorption peak wavelength. Also, the intermediate layer is formed by, for example, dispersing high-refractive-index microparticles (e.g., $TiO_2$ and $ZrO_2$) in a resin (e.g., an acrylic resin, a polycarbonate resin and a TAC resin).

The thickness of the intermediate layer 5 is not particularly limited and may be appropriately selected depending on the purpose. It is preferably 0.1 μm to 500 μm from the viewpoint of desired film formation. Also, the minimum thickness is more preferably 0.5 μm or more, particularly preferably 2 μm or more. The maximum thickness is more preferably 100 μm or less, particularly preferably 50 μm or less.

With respect to light having a main light-emitting wavelength, the minimum value of the specific refractive index $n_4$ of the intermediate layer 5 is preferably 1.55 or more, more preferably 1.65 or more, particularly preferably 1.7 or more; and the maximum value thereof is preferably 3.0 or less, more preferably 2.6 or less, particularly preferably 2 or less, from the viewpoint of stability of the material.

The forming method for the intermediate layer 5 is not particularly limited and may be appropriately selected depending on the purpose. Examples thereof include spin coating, inkjet coating and slit coating.

Among them, spin coating is preferred from the viewpoint of attaining uniform coating.

<Fine Concavo-Convex Pattern>

The fine concavo-convex pattern 6 reflects light transmitted through the intermediate layer 5 toward the first layer 3A of the light-emitting layer 2 for light extraction.

The shape of the fine concavo-convex pattern 6 is not particularly limited, so long as the cross-sectional shape thereof has portions projected and recessed with respect to the light-emitting layer 2, and may be, for example, a saw-like shape, a bellows-like shape and a square shape.

The pitch interval of the fine concavo-convex pattern 6 is not particularly limited and may be appropriately selected depending on the purpose. From the viewpoint of increase in light quantity, the minimum pitch interval is preferably 0.01λ or more, more preferably 0.05λ or more, still more preferably 0.1λ or more, particularly preferably 0.2λ or more; and the maximum pitch interval is preferably 100λ or less, more preferably 50λ or less, still more preferably 20λ or less, particularly preferably 10λ or less. Here, λ denotes a main light-emitting wavelength of light emitted from the light-emitting layer 2.

From the viewpoint of stable pattern formation, the minimum value of the specific pitch interval of the fine concavo-convex pattern 6 is preferably 50 nm or more, more preferably 100 nm or more, still more preferably 200 nm or more, particularly preferably 300 nm or more; and the maximum value thereof is preferably 10 μm or less, more preferably 6 μm or less, still more preferably 3 μm or less, particularly preferably 1 μm or less.

The forming method for the fine concavo-convex pattern 6 is not particularly limited and may be appropriately selected depending on the purpose.

For example, a light-absorbing resist (heat-mode resist) is applied, and the thus-applied resist is treated through heat-mode lithography.

Alternatively, a light-absorbing resist is applied and treated through heat-mode lithography to prepare a pattern (which is not necessarily made of metal). And, the pattern is used for shape transfer through imprinting or molding.

When formed in the above-described manner, the fine concavo-convex pattern can have a complicated shape containing a high-frequency component, and thus is improved in light controllability.

<<Reflective Layer>>

A reflective layer (not shown) may be formed on at least one surface of the fine concavo-convex pattern 6. Notably, the fine concavo-convex pattern 6 itself may be made of light-reflective material.

The material for the reflective layer is not particularly limited and may be appropriately selected depending on the purpose. Al, Ag, etc. are preferred from the viewpoint of attaining high reflectivity.

The thickness of the reflective layer is not particularly limited and may be appropriately selected depending on the purpose. It is preferably 10 nm to 10,000 nm.

The reflective layer having a thickness of 10 nm or more is advantageous in terms of high reflectivity. The reflective layer having a thickness of 10,000 nm or less is advantageous in terms of film formation.

The forming method for the reflective layer is not particularly limited and may be appropriately selected depending on the purpose. Examples thereof include various sputtering methods, vapor deposition methods and ion plating methods.

Among them, DC sputtering is preferred from the viewpoint of attaining high reflectivity.

Figure 4:
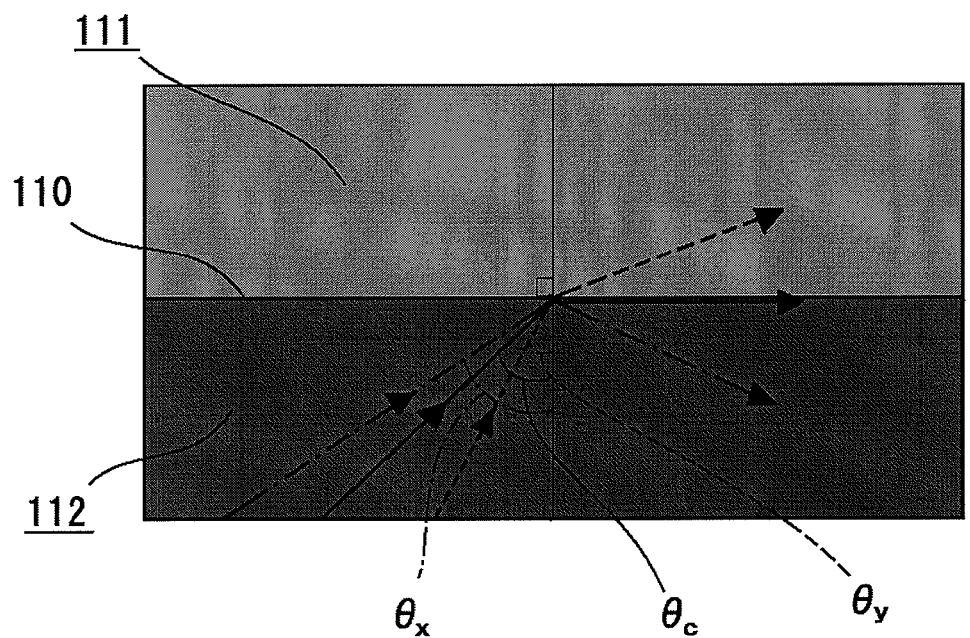
FIG. 4 is a schematic view used for describing critical angle $\theta_c$ on the interface between first and second layers.
Figure 5:
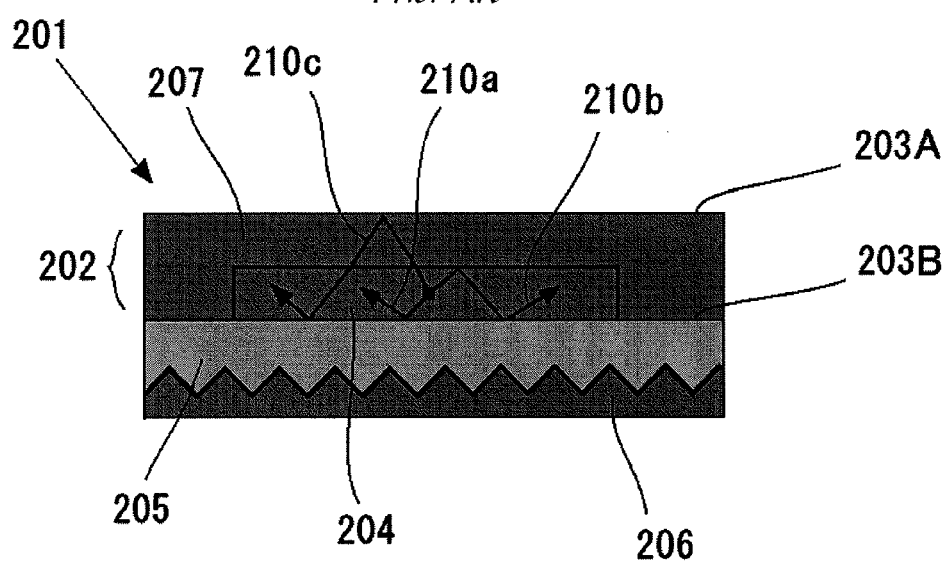
FIG. 5 is a schematic view used for describing problems a conventional light-emitting device has.

With reference to FIG. 1, next will be described the operation of the light-emitting device 1 having the above-described structure (see FIG. 4 in relation to critical angle $\theta_c$, etc.).

(1-1) Interface Between Light-Emitting Portion and Seal Layer

Light beam 10a which is emitted from the light-emitting portion 4 toward the first surface 3A of the light-emitting layer 2 and whose incident angle is $\theta_{y1}$ smaller than critical angle $\theta_{c1}$ passes through the interface between the light-emitting portion 4 and the seal layer 7 to enter the seal layer 7.

Meanwhile, light beam 10d whose incident angle is critical angle $\theta_c$ or angle $\theta_{x1}$ greater than critical angle $\theta_c$ is totally reflected on the interface between the light-emitting portion 4 and the seal layer 7 toward the second surface 3B of the light-emitting layer 2.

(1-2) Interface Between Light-Emitting Layer and Air (First Surface of Light-Emitting Layer)

Light beam 10a which is emitted from the light-emitting portion 4 to enter the seal layer 7 and whose incident angle is $\theta_{y2}$ smaller than critical angle $\theta_{c2}$ at the first surface 3A of the light-emitting layer 2 passes through the first surface 3A of the light-emitting layer 2 to be emitted outside.

Meanwhile, light beam 10d whose incident angle is critical angle $\theta_c$ or $\theta_{x2}$ greater than critical angle $\theta_c$ is totally reflected on the first surface of the light-emitting layer 2 toward the second surface 3B of the light-emitting layer 2.

(2-1) Interface Between Light-Emitting Layer and Intermediate Layer (Second Surface of Light-Emitting Layer)

Light beams 10b, 10c and 10d which travel toward the second surface 3B of the light-emitting layer 2 are not totally reflected on the second surface 3B of the light-emitting layer (i.e., the interface between the light-emitting portion 4 and the intermediate layer 5) and enter the fine concavo-convex pattern 6. This is because the refractive index $n_3$ of the light-emitting portion 4 is almost the same as the refractive index $n_4$ of the intermediate layer 5 and thus, the light-emitting portion 4 and the intermediate layer 5 function optically substantially as one layer.

(2-2) Interface Between Intermediate Layer and Fine Concavo-Convex Pattern

Light beams 10c, 10d and 10d, which travel toward the fine concavo-convex pattern 6, are reflected on the fine concavo-convex pattern 6 toward the second surface 3B of the light-emitting layer 2, and pass through the intermediate layer 5, the light-emitting portion 4 and the seal layer 7 to be emitted outside from the first surface 3A of the light-emitting layer 2 similar to the case of light beams 10a.

As described above, since all the light beams 10a to 10d, which are emitted from the light-emitting layer 2, are emitted outside from the first surface 3A of the light-emitting layer 2, the light-emitting device 1 of the present invention is improved in light-extraction efficiency.

<Other Members>

Other members are not particularly limited and may be appropriately selected depending on the purpose. Examples thereof include a substrate and a protective layer.

<<Substrate>>

The substrate may be appropriately selected depending on the purpose without particular limitation, and is preferably those which do not diffuse or damp light emitted from an organic compound layer. Examples of the materials for the substrate include inorganic materials such as yttria-stabilized zirconia (YSZ) and glass; and organic materials such as polyesters (e.g., polyethylene terephthalate, polybutylene phthalate and polyethylene naphthalate), polystyrene, polycarbonate, polyether sulfone, polyarylate, polyimide, polycycloolefin, norbornene resins and poly(chlorotrifluoroethylene).

For example, when the substrate is made of glass, the glass is preferably alkali-free glass in order to reduce ions eluted from it. Also, when soda-lime glass is used for the material of the substrate, a barrier coat of silica, etc., is preferably provided on the substrate. The organic materials are preferably used since they are excellent in heat resistance, dimensional stability, solvent resistance, electrical insulation and processability.

The shape, structure, size, etc. of the substrate are not particularly limited and may be appropriately selected depending on, for example, the application/purpose of the formed light-emitting device. In general, the shape thereof is preferably a sheet shape. The substrate may have a single- or multi-layered structure, and may be a single member or a combination of two or more members.

The substrate may be colorless or colored transparent. It is preferably colorless transparent, since such colorless transparent substrate does not diffuse or damp light emitted from an organic light-emitting layer.

The substrate may be provided with a moisture permeation-preventing layer (gas barrier layer) on the front or back surface thereof.

The moisture permeation-preventing layer (gas barrier layer) is preferably made from an inorganic compound such as silicon nitride and silicon oxide, and may be formed through, for example, high-frequency sputtering.

When a thermoplastic substrate is used, a hard coat layer, an under coat layer and other layers may be additionally provided as necessary.

<<Protective Layer>>

The light-emitting device of the present invention may be entirely protected with a protective layer.

The material contained in the protective layer may be any materials, so long as they have the function of preventing permeation of water, oxygen, etc., which promote degradation of the device.

Specific examples thereof include metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; metal nitrides such as $SiN_x$ and $SiN_xO_y$; metal fluorides such as $MgF_2$, LiF, $AlF_3$ and $CaF_2$; polyethylenes, polypropylenes, polymethyl methacrylates, polyimides, polyureas, polytetrafluoroethylenes, polychlorotrifluoroethylens, polydichlorofluoroethylenes, copolymers of chlorotrifluoroethylens and dichlorofluoroethylenes, copolymers produced through compolymerization of a monomer mixture containing tetrafluoroethylene and at least one comonomer, fluorine-containing copolymers containing a ring structure in the copolymerization main chain, water-absorbing materials each having a water absorption rate of 1% or more, and moisture permeation preventive substances each having a water absorption rate of 0.1% or less.

The method for forming the protective layer is not particularly limited. Examples thereof include a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method and a transfer method.

(Display, Etc.)

A display of the present invention is not particularly limited, so long as it has a plurality of light-emitting portions, and may be appropriately selected depending on the purpose.

Figure 2:
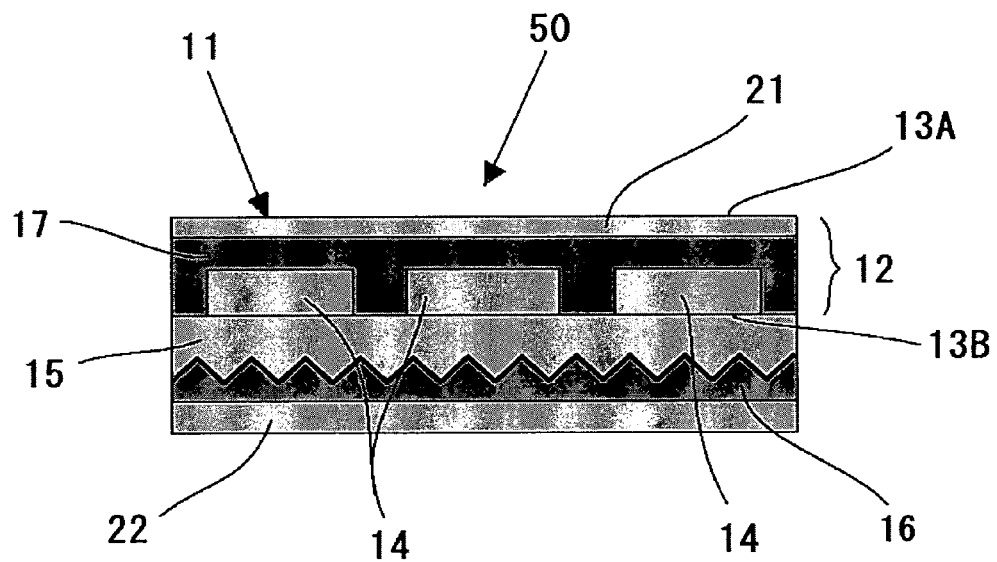
FIG. 2 is an explanatory cross-sectional view for a light-emitting device according to another embodiment of the present invention, and a display containing the light-emitting device.
Figure 3:
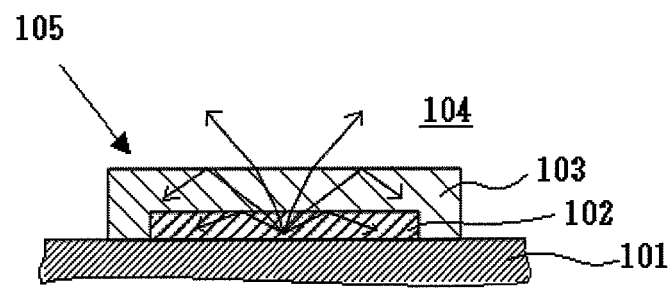
FIG. 3 is an explanatory cross-sectional view of a conventional light-emitting device.

FIG. 2 exemplarily shows a light-emitting device 11 of the present invention which has a plurality of light-emitting portions 14, and a display 50 containing the light-emitting device. This display contains the light-emitting device 11 which includes a light-emitting layer 12 containing the light-emitting portions 14; an intermediate layer 15; and a fine concavo-convex pattern 16 in this order. The fine concavo-convex pattern 16 reflects light emitted from the light-emitting layer 12 and has a cross-sectional shape which has portions projected and recessed with respect to the light-emitting layer. The light-emitting device 11 can be used as the display 50.

Notably, reference numerals 21 and 22 denote a protective layer and a substrate, respectively.

As a method for forming a full color-type display, there are known, for example, as described in "Monthly Display," September 2000, pp. 33 to 37, a tricolor light emission method by arranging, on a substrate, organic EL devices emitting lights corresponding to three primary colors (blue color (B), green color (G) and red color (R)); a white color method by separating white light emitted from an organic EL device for white color emission into three primary colors through a color filter; and a color conversion method by converting a blue light emitted from an organic EL device for blue light emission into red color (R) and green color (G) through a fluorescent dye layer.

Further, by combining a plurality of organic EL devices emitting lights of different colors which are obtained by the above-described methods, plane-type light sources emitting lights of desired colors can be obtained. For example, there are exemplified white light-emitting sources obtained by combining blue and yellow light emitting devices, and white light-emitting sources obtained by combining blue, green and red light light-emitting devices.

One exemplary light-emitting portion is an organic EL device, which will next be described in detail. However, the light-emitting device is not limited to the organic EL device and may be, for example, an inorganic EL device, an LED and a photodiode.

<Organic EL Layer>

The organic EL layer includes a substrate, a cathode, an anode and an organic compound layer including an organic light-emitting layer, wherein the cathode and the anode are laid over the substrate, and the organic light-emitting layer is sandwiched between the cathode and the anode. In terms of the function of a light-emitting device, at least one of the anode and the cathode is preferably transparent.

As a lamination pattern of the organic compound layer, preferably, a hole-transport layer, an organic light-emitting layer and an electron transport layer are laminated in this order from the anode side. Moreover, a hole-injection layer is provided between the hole-transport layer and the cathode, and/or an electron-transportable intermediate layer is provided between the organic light-emitting layer and the electron transport layer. Also, a hole-transportable intermediate layer may be provided between the organic light-emitting layer and the hole-transport layer. Similarly, an electron-injection layer may be provided between the cathode and the electron-transport layer.

Notably, each layer may be composed of a plurality of secondary layers.

The organic light-emitting layer corresponds to a light-emitting layer. Also, a transparent layer(s) of the anode, cathode, and organic compound layers (i.e., a layer(s) having optical transparency) correspond(s) to a light-transmitting layer.

Each of the constituent layers of the organic compound layer can be suitably formed in accordance with any of a dry film-forming method (e.g., a vapor deposition method and a sputtering method); a transfer method; a printing method; an ink-jet method; and a spray method.

<<Anode>>

In general, the anode may be any material, so long as it has the function of serving as an electrode which supplies holes to the organic compound layer. The shape, structure, size, etc. thereof are not particularly limited and may be appropriately selected from known electrode materials depending on the application/purpose of the light-emitting device. As described above, the anode is generally provided as a transparent anode.

Preferred examples of the materials for the anode include metals, alloys, metal oxides, conductive compounds and mixtures thereof. Specific examples include conductive metal oxides such as tin oxides doped with, for example, antimony and fluorine (ATO and FTO); tin oxide, zinc oxide, indium oxide, indium tin oxide (ITO) and indium zinc oxide (IZO); metals such as gold, silver, chromium and nickel; mixtures or laminates of these metals and the conductive metal oxides; inorganic conductive materials such as copper iodide and copper sulfide; organic conductive materials such as polyaniline, polythiophene and polypyrrole; and laminates of these materials and ITO. Among them, conductive metal oxides are preferred. In particular, ITO is preferred from the viewpoints of productivity, high conductivity, transparency, etc.

The anode may be formed on the substrate by a method which is appropriately selected from wet methods such as printing methods and coating methods; physical methods such as vacuum deposition methods, sputtering methods and ion plating method; and chemical methods such as CVD and plasma CVD methods, in consideration of suitability for the material for the anode. For example, when ITO is used as a material for the anode, the anode may be formed in accordance with a DC or high-frequency sputtering method, a vacuum deposition method, or an ion plating method.

In the organic EL layer, a position at which the anode is to be formed is not particularly limited and may be appropriately determined depending on the application/purpose of the light-emitting device. Preferably, the anode is formed on the substrate. In this case, the anode may be entirely or partially formed on one surface of the substrate.

Patterning for forming the anode may be performed by a chemical etching method such as photolithography; a physical etching method such as etching by laser; a method of vacuum deposition or sputtering using a mask; a lift-off method; or a printing method.

The thickness of the anode may be appropriately selected depending on the material for the anode and is, therefore, not definitely determined. It is generally about 10 nm to about 50 μm, preferably 50 nm to 20 μm.

The resistance of the anode is preferably $10^3$ Ω/square or less, more preferably $10^2$ Ω/square or less. When the anode is transparent, it may be colorless or colored. For extracting luminescence from the transparent anode side, it is preferred that the anode has a light transmittance of 60% or higher, more preferably 70% or higher.

Concerning transparent anodes, there is a detail description in "TOUMEI DOUDEN-MAKU NO SHINTENKAI (Novel Developments in Transparent Electrode Films)" edited by Yutaka Sawada, published by C.M.C. in 1999, the contents of which can be applied to the present invention. When a plastic substrate having a low heat resistance is used, it is preferred that ITO or IZO is used to form a transparent anode at a low temperature of 150° C. or lower.

<<Cathode>>

In general, the cathode may be any material so long as it has the function of serving as an electrode which injects electrons into the organic compound layer. The shape, structure, size, etc. thereof are not particularly limited and may be appropriately selected from known electrode materials depending on the application/purpose of the light-emitting device.

Examples of the materials for the cathode include metals, alloys, metal oxides, conductive compounds and mixtures thereof. Specific examples thereof include alkali metals (e.g., Li, Na, K and Cs), alkaline earth metals (e.g., Mg and Ca), gold, silver, lead, aluminum, sodium-potassium alloys, lithium-aluminum alloys, magnesium-silver alloys and rare earth metals (e.g., indium and ytterbium). These may be used individually, but it is preferred that two or more of them are used in combination from the viewpoint of satisfying both stability and electron-injection property.

Among them, as the materials for forming the cathode, alkali metals or alkaline earth metals are preferred in terms of excellent electron-injection property, and materials containing aluminum as a major component are preferred in terms of excellent storage stability.

The term "material containing aluminum as a major component" refers to a material composed of aluminum alone; alloys containing aluminum and 0.01% by mass to 10% by mass of an alkali or alkaline earth metal; or the mixtures thereof (e.g., lithium-aluminum alloys and magnesium-aluminum alloys).

The materials for the cathode are described in detail in JP-A Nos. 02-15595 and 05-121172. The materials described in these literatures can be used in the present invention.

The method for forming the cathode is not particularly limited, and the cathode may be formed by a known method. For example, the cathode may be formed by a method which is appropriately selected from wet methods such as printing methods and coating methods; physical methods such as vacuum deposition methods, sputtering methods and ion plating methods; and chemical methods such as CVD and plasma CVD methods, in consideration of suitability for the material for the cathode. For example, when a metal (or metals) is (are) selected as a material (or materials) for the cathode, one or more of them may be applied simultaneously or sequentially by a sputtering method.

Patterning for forming the cathode may be performed by a chemical etching method such as photolithography; a physical etching method such as etching by laser; a method of vacuum deposition or sputtering using a mask; a lift-off method; or a printing method.

In the organic EL layer, a position at which the cathode is to be formed is not particularly limited, and the cathode may be entirely or partially formed on the organic compound layer.

Furthermore, a dielectric layer having a thickness of 0.1 nm to 5 nm and being made, for example, of fluorides and oxides of an alkali or alkaline earth metal may be inserted between the cathode and the organic compound layer. The dielectric layer may be considered to be a kind of electron-injection layer. The dielectric layer may be formed by, for example, a vacuum deposition method, a sputtering method and an ion plating method.

The thickness of the cathode may be appropriately selected depending on the material for the cathode and is, therefore, not definitely determined. It is generally about 10 nm to about 5 μm, and preferably 50 nm to 1 μm.

Moreover, the cathode may be transparent or opaque. The transparent cathode may be formed as follows. Specifically, a 1 nm- to 10 nm-thick thin film is formed from a material for the cathode, and a transparent conductive material (e.g., ITO and IZO) is laminated on the thus-formed film.

<<Organic Compound Layer>>

The organic EL device of the present invention includes at least one organic compound layer including an organic light-emitting layer. Examples of the other organic compound layers than the organic light-emitting layer include a hole-transport layer, an electron transport layer, a hole blocking layer, an electron blocking layer, a hole-injection layer and an electron injection layer.

In the organic EL device, the respective layers constituting the organic compound layer can be suitably formed by any of a dry film-forming method such as a vapor deposition method and a sputtering method; a wet film-forming method; a transfer method; a printing method; and an ink-jet method.

<<<Organic Light-Emitting Layer>>>

The organic light-emitting layer is a layer having the functions of receiving holes from the anode, the hole-injection layer, or the hole-transport layer, and receiving electrons from the cathode, the electron-injection layer, or the electron transport layer, and providing a field for recombination of the holes with the electrons for light emission, when an electric field is applied.

The light-emitting layer in the present invention may be composed only of a light-emitting material, or may be a layer formed form a mixture of a light-emitting dopant and a host material. The light-emitting dopant may be a fluorescent or phosphorescent light-emitting material, and may contain two or more species. The host material is preferably a charge-transporting material. The host material may contain one or more species, and, for example, is a mixture of a hole-transporting host material and an electron-transporting host material. Further, a material which does not emit light nor transport any charge may be contained in the organic light-emitting layer.

The organic light-emitting layer may be a single layer or two or more layers. When it is two or more layers, the layers may emit lights of different colors.

The above light-emitting dopant may be, for example, a phosphorescent light-emitting material (phosphorescent light-emitting dopant) and a fluorescent light-emitting material (fluorescent light-emitting dopant).

The organic light-emitting layer may contain two or more different light-emitting dopants for improving color purity and/or expanding the wavelength region of light emitted therefrom. From the viewpoint of drive durability, it is preferred that the light-emitting dopant is those satisfying the following relation(s) with respect to the above-described host compound: i.e., 1.2 eV>difference in ionization potential (ΔIp)>0.2 eV and/or 1.2 eV>difference in electron affinity (ΔEa)>0.2 eV.

The fluorescent light-emitting material is not particularly limited and may be appropriately selected depending on the purpose. Examples thereof include complexes containing a transition metal atom or a lanthanoid atom.

The transition metal atom is not particularly limited and may be selected depending on the purpose. Preferred are ruthenium, rhodium, palladium, tungsten, rhenium, osmium, iridium gold, silver, copper and platinum. More preferred are rhenium, iridium and platinum. Particularly preferred are iridium and platinum.

The lanthanoid atom is not particularly limited and may be appropriately selected depending on the purpose. Examples thereof include lanthanum, cerium, praseodymium, neodymium, samarium, europium, gadolinium, terbium, dysprosium, holmium, erbium, thulium, ytterbium and lutetium, with neodymium, europium and gadolinium being preferred.

Examples of ligands in the complex include those described in, for example, "Comprehensive Coordination Chemistry" authored by G. Wilkinson et al., published by Pergamon Press Company in 1987; "Photochemistry and Photophysics of Coordination Compounds" authored by H. Yersin, published by Springer-Verlag Company in 1987; and "YUHKI KINZOKU KAGAKU—KISO TO OUYOU— (Metalorganic Chemistry—Fundamental and Application—)" authored by Akio Yamamoto, published by Shokabo Publishing Co., Ltd. in 1982.

Preferred examples of the ligands include halogen ligands (preferably, chlorine ligand), aromatic carbon ring ligands (preferably 5 to 30 carbon atoms, more preferably 6 to 30 carbon atoms, still more preferably 6 to 20 carbon atoms, particularly preferably 6 to 12 carbon atoms, such as cyclopentadienyl anion, benzene anion and naphthyl anion); nitrogen-containing hetero cyclic ligands (preferably 5 to 30 atoms, more preferably 6 to 30 carbon atoms, still more preferably 6 to 20 carbon atoms, particularly preferably 6 to 12 carbon atoms, such as phenyl pyridine, benzoquinoline, quinolinol, bipyridyl and phenanthrorine), diketone ligands (e.g., acetyl acetone), carboxylic acid ligands (preferably 2 to 30 carbon atoms, more preferably 2 to 20 carbon atoms, still more preferably 2 to 16 carbon atoms, such as acetic acid ligand), alcoholate ligands (preferably 1 to 30 carbon atoms, more preferably 1 to 20 carbon atoms, still more preferably 6 to 20 carbon atoms, such as phenolate ligand), silyloxy ligands (preferably 3 to 40 carbon atoms, more preferably 3 to 30 carbon atoms, still more preferably 3 to 20 carbon atoms, such as trimethyl silyloxy ligand, dimethyl tert-butyl silyloxy ligand and triphenyl silyloxy ligand), carbon monoxide ligand, isonitrile ligand, cyano ligand, phosphorus ligand (preferably 3 to 40 carbon atoms, more preferably 3 to 30 carbon atoms, still more preferably 3 to 20 carbon atoms, particularly preferably, 6 to 20 carbon atoms, such as triphenyl phosphine ligand), thiolate ligands (preferably 1 to 30 carbon atoms, more preferably 1 to 20 carbon atoms, still more preferably 6 to 20 carbon atoms, such as phenyl thiolate ligand) and phosphine oxide ligands (preferably 3 to 30 carbon atoms, more preferably 8 to 30 carbon atoms, particularly preferably 18 to 30 carbon atoms, such as triphenyl phosphine oxide ligand), with nitrogen-containing hetero cyclic ligand being more preferred.

The above-described complexes may be a complex containing one transition metal atom in the compound, or a so-called polynuclear complex containing two or more transition metal atoms. In the latter case, the complexes may contain different metal atoms at the same time.

Among them, specific examples of the light-emitting dopants include phosphorescence luminescent compounds described in Patent Literatures such as U.S. Pat. No. 6,303,238B1, U.S. Pat. No. 6,097,147, WO00/57676, WO00/70655, WO01/08230, WO01/39234A2, WO01/41512A1, WO02/02714A2, WO02/15645A1, WO02/44189A1, WO05/19373A2, JP-A Nos. 2001-247859, 2002-302671, 2002-117978, 2003-133074, 2002-235076, 2003-123982 and 2002-170684, EP1211257, JP-A Nos. 2002-226495, 2002-234894, 2001-247859, 2001-298470, 2002-173674, 2002-203678, 2002-203679, 2004-357791, 2006-256999, 2007-19462, 2007-84635 and 2007-96259. Among them, Ir complexes, Pt complexes, Cu complexes, Re complexes, W complexes, Rh complexes, Ru complexes, Pd complexes, Os complexes, Eu complexes, Tb complexes, Gd complexes, Dy complexes and Ce complexes are preferred, with Ir complexes, Pt complexes and Re complexes being more preferred. Among them, Ir complexes, Pt complexes, and Re complexes each containing at least one coordination mode of metal-carbon bonds, metal-nitrogen bonds, metal-oxygen bonds and metal-sulfur bonds are still more preferred. Furthermore, Ir complexes, Pt complexes, and Re complexes each containing a tri-dentate or higher poly-dentate ligand are particularly preferred from the viewpoints of, for example, light-emission efficiency, drive durability and color purity. For example, tris(2-phenylpyridine)iridium ($Ir(ppy)_3$) can be used.

The fluorescence luminescent dopant is not particularly limited and may be appropriately selected depending on the purpose. Examples thereof include benzoxazole, benzoimidazole, benzothiazole, styrylbenzene, polyphenyl, diphenylbutadiene, tetraphenylbutadiene, naphthalimide, coumarin, pyran, perinone, oxadiazole, aldazine, pyralidine, cyclopentadiene, bis-styrylanthracene, quinacridone, pyrrolopyridine, thiadiazolopyridine, cyclopentadiene, styrylamine, aromatic dimethylidene compounds, condensed polyaromatic compounds (e.g., anthracene, phenanthroline, pyrene, perylene, rubrene and pentacene), various metal complexes (e.g., metal complexes of 8-quinolynol, pyromethene complexes and rare-earth complexes), polymer compounds (e.g., polythiophene, polyphenylene and polyphenylenevinylene), organic silanes and derivatives thereof.

Specific examples of the luminescent dopants include the following compounds, which should be construed as limiting the present invention thereto.

D-1

D-2

D-3

D-4

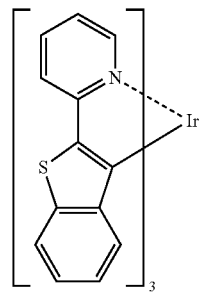

D-5

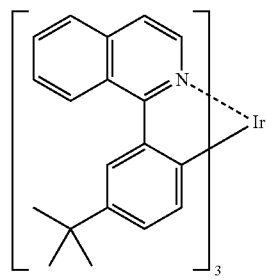

D-6

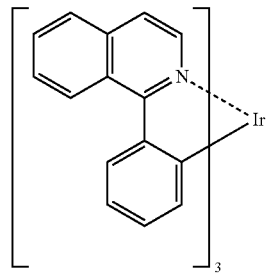

D-7

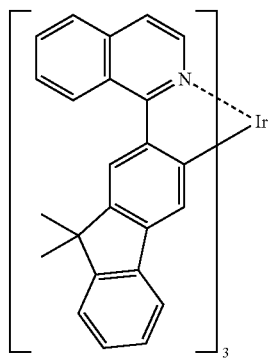

D-8

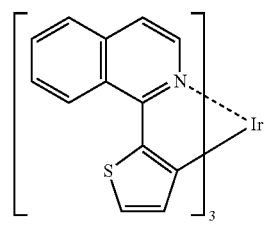

D-9

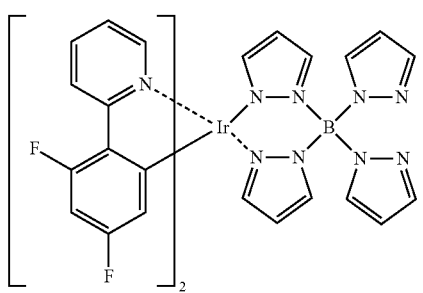
D-10
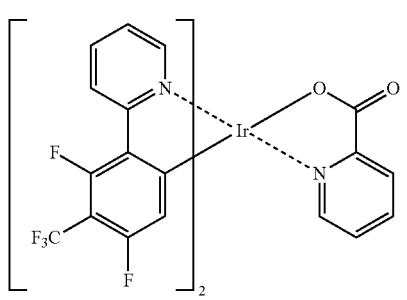
D-11
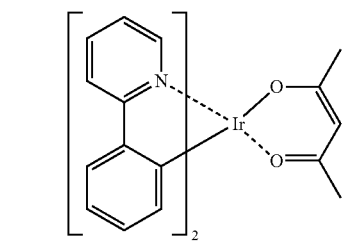
D-12
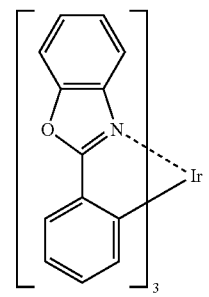
D-13
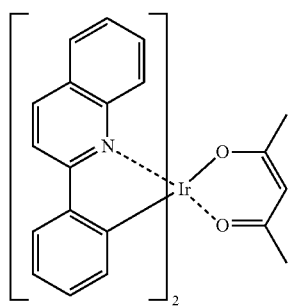
D-14
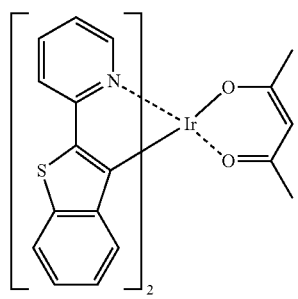
D-15
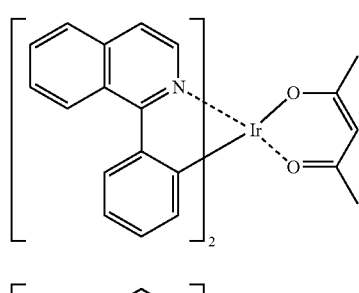
D-16
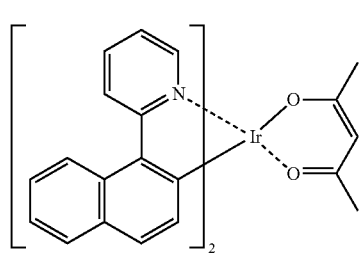
D-17
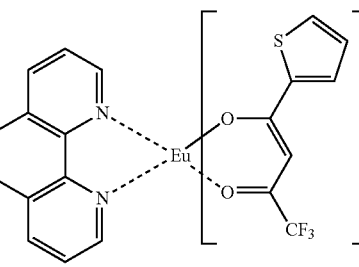
D-18
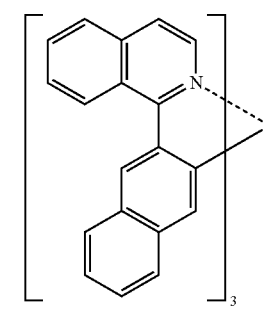
D-19
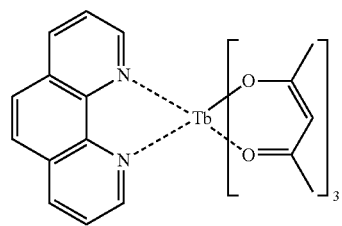
D-20

D-21
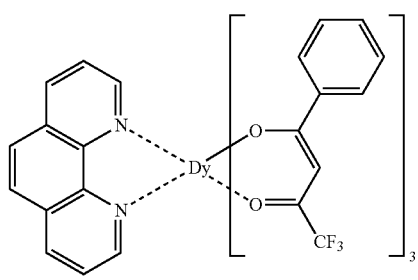
D-22
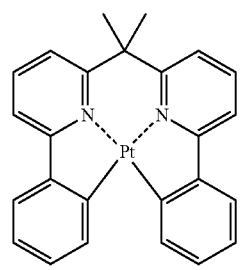
D-23
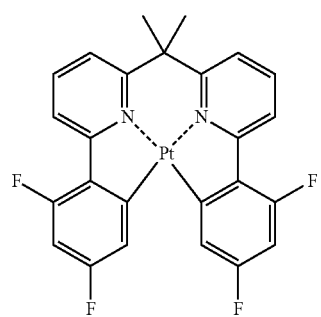
D-24
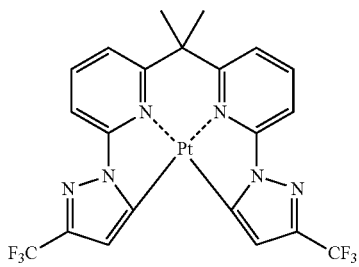
D-25
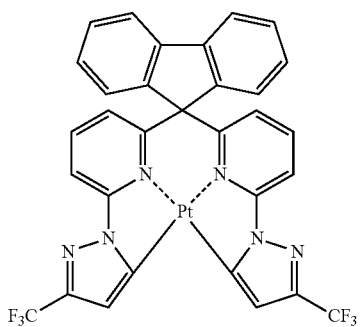
D-26
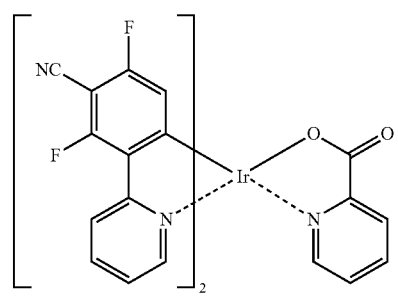
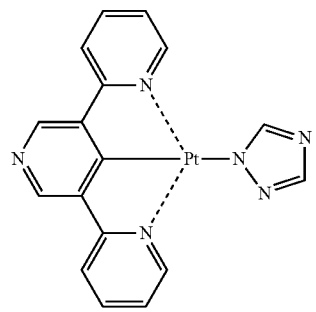
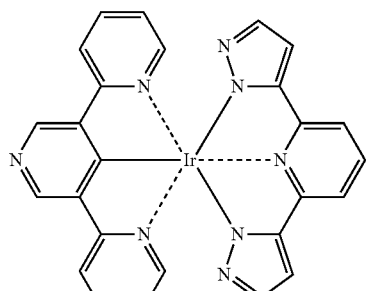
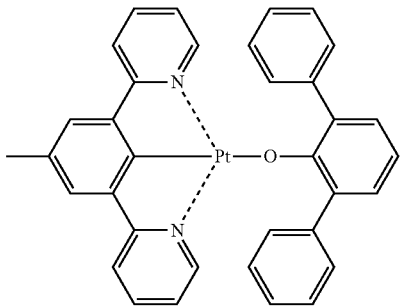
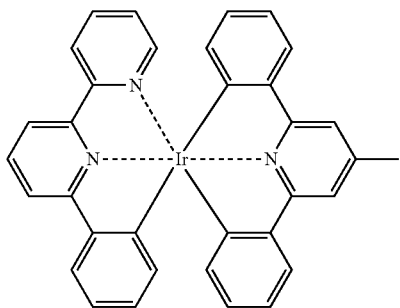

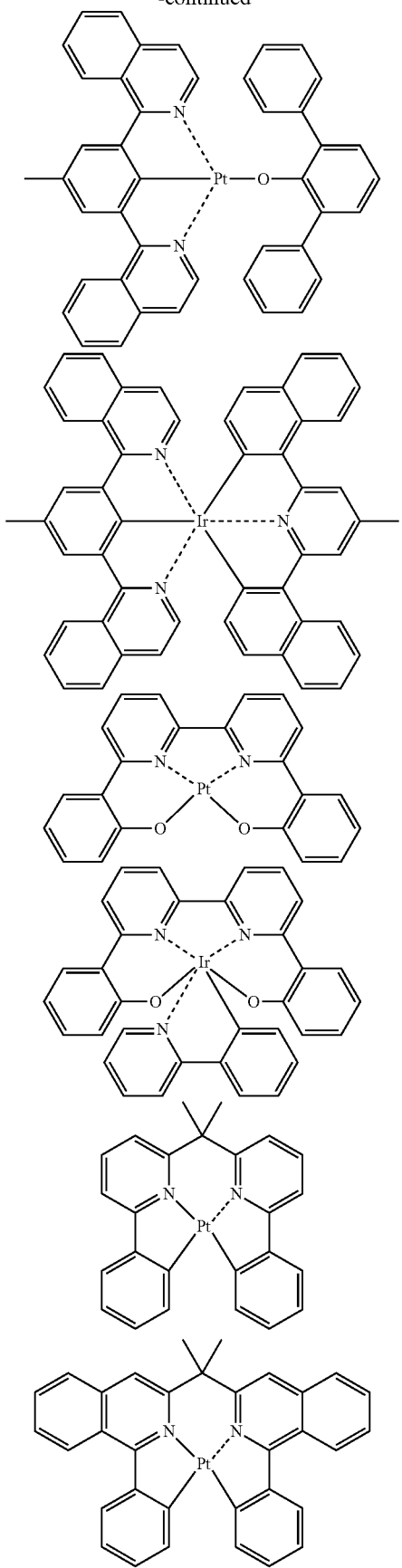
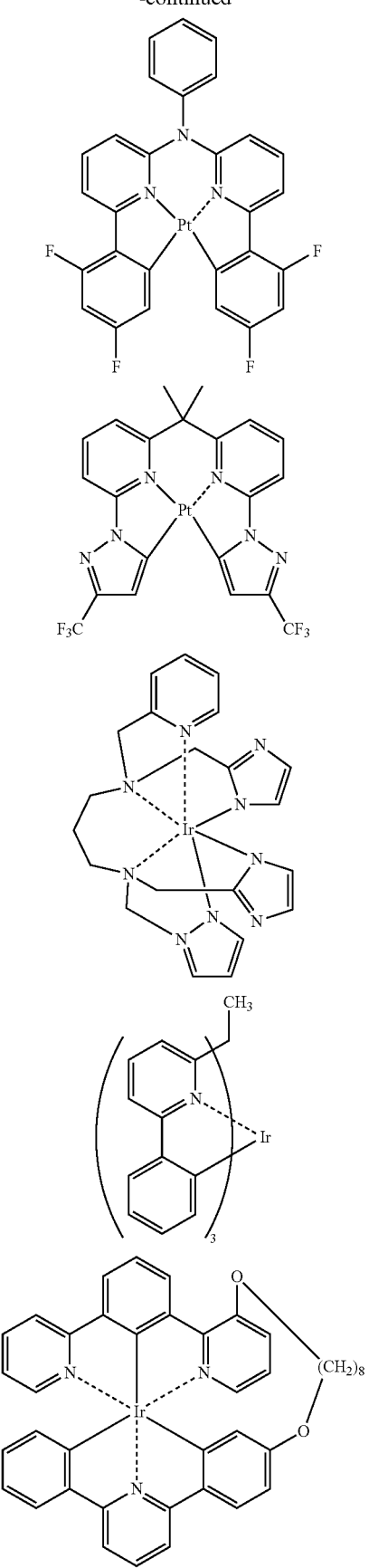

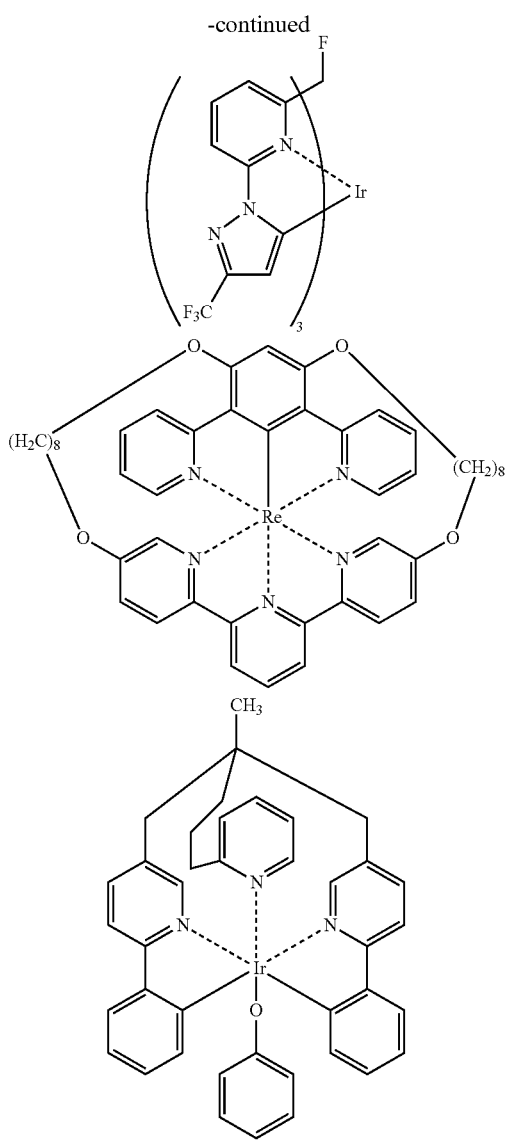

The light-emitting dopant is contained in the light-emitting layer in an amount of 0.1% by mass to 50% by mass with respect to the total amount of the compounds generally forming the light-emitting layer. From the viewpoints of drive durability and external light-emitting efficiency, it is preferably contained in an amount of 1% by mass to 50% by mass, more preferably 2% by mass to 40% by mass.

Although the thickness of the light-emitting layer is not particularly limited, in general, it is preferably 2 nm to 500 nm preferred. From the viewpoint of external light-emitting efficiency, it is more preferably 3 nm to 200 nm, particularly preferably 5 nm to 100 nm.

The host material may be hole transporting host materials excellent in hole transporting property (which may be referred to as a "hole transporting host") or electron transporting host compounds excellent in electron transporting property (which may be referred to as an "electron transporting host").

Examples of the hole transporting host materials contained in the organic light-emitting layer include pyrrole, indole, carbazole, azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, conductive high-molecular-weight oligomers (e.g., thiophene oligomers and polythiophenes), organic silanes, carbon films and derivatives thereof. For example, 1,3-bis(carbazol-9-yl)benzene (mCP) can be used.

Among them, indole derivatives, carbazole derivatives, aromatic tertiary amine compounds and thiophene derivatives are preferred. Also, compounds each containing a carbazole group in the molecule are more preferred. Further, compounds each containing a t-butyl-substituted carbazole group are particularly preferred.

The electron transporting host to be used in the organic light-emitting layer preferably has an electron affinity Ea of 2.5 eV to 3.5 eV, more preferably 2.6 eV to 3.4 eV, particularly preferably 2.8 eV to 3.3 eV, from the viewpoints of improvement in durability and decrease in drive voltage. Also, it preferably has an ionization potential Ip of 5.7 eV to 7.5 eV, more preferably 5.8 eV to 7.0 eV, particularly preferably 5.9 eV to 6.5 eV, from the viewpoints of improvement in durability and decrease in drive voltage.

Examples of the electron transporting host include pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyradine, fluorine-substituted aromatic compounds, heterocyclic tetracarboxylic anhydrides (e.g., naphthalene and perylene), phthalocyanine, derivatives thereof (which may form a condensed ring with another ring) and various metal complexes such as metal complexes of 8-quinolynol derivatives, metal phthalocyanine, and metal complexes having benzoxazole or benzothiazole as a ligand.

Preferred electron transporting hosts are metal complexes, azole derivatives (e.g., benzimidazole derivatives and imidazopyridine derivatives) and azine derivatives (e.g., pyridine derivatives, pyrimidine derivatives and triazine derivatives). Among them, metal complexes are preferred in terms of durability. As the metal complexes (A), preferred are those containing a ligand which has at least one nitrogen atom, oxygen atom, or sulfur atom and which is coordinated with the metal.

The metal ion contained in the metal complex is not particularly limited and may be appropriately selected depending on the purpose. It is preferably a beryllium ion, a magnesium ion, an aluminum ion, a gallium ion, a zinc ion, an indium ion, a tin ion, a platinum ion or a palladium ion; more preferably is a beryllium ion, an aluminum ion, a gallium ion, a zinc ion, a platinum ion or a palladium ion; particularly preferably is an aluminum ion, a zinc ion or a palladium ion.

Although there are a variety of known ligands to be contained in the metal complexes, examples thereof include those described in, for example, "Photochemistry and Photophysics of Coordination Compounds" authored by H. Yersin, published by Springer-Verlag Company in 1987; and "YUHKI KINZOKU KAGAKU—KISO TO OUYOU—(Metalorganic Chemistry—Fundamental and Application—)" authored by Akio Yamamoto, published by Shokabo Publishing Co., Ltd. in 1982.

The ligand is preferably nitrogen-containing heterocyclic ligands (preferably having 1 to 30 carbon atoms, more preferably 2 to 20 carbon atoms, particularly preferably 3 to 15 carbon atoms). It may be a unidentate ligand or a bi- or higher-dentate ligand. Preferred are bi- to hexa-dentate ligands, and mixed ligands of bi- to hexa-dentate ligands with a unidentate ligand.

Examples of the ligand include azine ligands (e.g., pyridine ligands, bipyridyl ligands and terpyridine ligands); hydroxyphenylazole ligands (e.g., hydroxyphenylbenzoimidazole ligands, hydroxyphenylbenzoxazole ligands, hydroxyphenylimidazole ligands and hydroxyphenylimidazopyridine ligands); alkoxy ligands (those having preferably 1 to 30 carbon atoms, more preferably 1 to 20 carbon atoms, particularly preferably 1 to 10 carbon atoms, such as methoxy, ethoxy, butoxy and 2-ethylhexyloxy); and aryloxy ligands (those having preferably 6 to 30 carbon atoms, more preferably 6 to 20 carbon atoms, particularly preferably 6 to 12 carbon atoms, such as phenyloxy, 1-naphthyloxy, 2-naphthyloxy, 2,4,6-trimethylphenyloxy and 4-biphenyloxy).

Further examples include heteroaryloxy ligands (those having preferably 1 to 30 carbon atoms, more preferably 1 to 20 carbon atoms, particularly preferably 1 to 12 carbon atoms, examples of which include pyridyloxy, pyrazyloxy, pyrimidyloxy and quinolyloxy); alkylthio ligands (those having preferably 1 to 30 carbon atoms, more preferably 1 to 20 carbon atoms, particularly preferably 1 to 12 carbon atoms, examples of which include methylthio and ethylthio); arylthio ligands (those having preferably 6 to 30 carbon atoms, more preferably 6 to 20 carbon atoms, particularly preferably 6 to 12 carbon atoms, examples of which include phenylthio); heteroarylthio ligands (those having preferably 1 to 30 carbon atoms, more preferably 1 to 20 carbon atoms, particularly preferably 1 to 12 carbon atoms, examples of which include pyridylthio, 2-benzimidazolylthio, 2-benzoxazolylthio and 2-benzothiazolylthio); siloxy ligands (those having preferably 1 to 30 carbon atoms, more preferably 3 to 25 carbon atoms, particularly preferably 6 to 20 carbon atoms, examples of which include a triphenylsiloxy group, a triethoxysiloxy group and a triisopropylsiloxy group); aromatic hydrocarbon anion ligands (those having preferably 6 to 30 carbon atoms, more preferably 6 to 25 carbon atoms, particularly preferably 6 to 20 carbon atoms, examples of which include a phenyl anion, a naphthyl anion and an anthranyl anion); aromatic heterocyclic anion ligands (those having preferably 1 to 30 carbon atoms, more preferably 2 to 25 carbon atoms, and particularly preferably 2 to 20 carbon atoms, examples of which include a pyrrole anion, a pyrazole anion, a triazole anion, an oxazole anion, a benzoxazole anion, a thiazole anion, a benzothiazole anion, a thiophene anion and a benzothiophene anion); and indolenine anion ligands. Among them, nitrogen-containing heterocyclic ligands, aryloxy ligands, heteroaryloxy groups, siloxy ligands, etc. are preferred, and nitrogen-containing heterocyclic ligands, aryloxy ligands, siloxy ligands, aromatic hydrocarbon anion ligands, aromatic heterocyclic anion ligands, etc. are more preferred.

Examples of the metal complex electron transporting host include compounds described in, for example, JP-A Nos. 2002-235076, 2004-214179, 2004-221062, 2004-221065, 2004-221068 and 2004-327313.

In the light-emitting layer, it is preferred that the lowest triplet excitation energy (T1) of the host material is higher than T1 of the phosphorescence light-emitting material, from the viewpoints of color purity, light-emitting efficiency and drive durability.

Although the amount of the host compound added is not particularly limited, it is preferably 15% by mass to 95% by mass with respect to the total amount of the compounds forming the light-emitting layer, in terms of light emitting efficiency and drive voltage.

<<Hole-Injection Layer and Hole-Transport Layer>>

The hole-injection layer and hole-transport layer are layers having the function of receiving holes from the anode or from the anode side and transporting the holes to the cathode side. Materials to be incorporated into the hole-injection layer or the hole-transport layer may be a low-molecular-weight compound or a high-molecular-weight compound.

Specifically, these layers preferably contain, for example, pyrrole derivatives, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine compounds, phthalocyanine compounds, porphyrin compounds, thiophene derivatives, organosilane derivatives and carbon.

Also, an electron-accepting dopant may be incorporated into the hole-injection layer or the hole-transport layer of the organic EL device. The electron-accepting dopant may be, for example, an inorganic or organic compound, so long as it has electron accepting property and the function of oxidizing an organic compound.

Specific examples of the inorganic compound include metal halides (e.g., ferric chloride, aluminum chloride, gallium chloride, indium chloride and antimony pentachloride) and metal oxides (e.g., vanadium pentaoxide and molybdenum trioxide).

As the organic compounds, those having a substituent such as a nitro group, a halogen, a cyano group and a trifluoromethyl group; quinone compounds; acid anhydride compounds; and fullerenes may be preferably used.

In addition, there can be preferably used compounds described in, for example, JP-A Nos. 06-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637 and 2005-209643.

Among them, preferred are hexacyanobutadiene, hexacyanobenzene, tetracyanoethylene, tetracyanoquinodimethane, tetrafluorotetracyanoquinodimethane (F4-TCNQ), p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine and fullerene $C_{60}$. More preferred are hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, 4,4',4"-tris(2-naphthylphenylamino)triphenylamine (2-TNATA), N,N'-dinaphthyl-N,N'-diphenyl-[1,1'-biphenyl]-4,4'-diamine (α-NPD) and 2,3,5,6-tetracyanopyridine. Particularly preferred is tetrafluorotetracyanoquinodimethane.

These electron-accepting dopants may be used alone or in combination. Although the amount of the electron-accepting dopant used depends on the type of material, the dopant is preferably used in an amount of 0.01% by mass to 50% by mass, more preferably 0.05% by mass to 20% by mass, particularly preferably 0.1% by mass to 10% by mass, with respect to the material of the hole-transport layer.

The thicknesses of the hole-injection layer and the hole-transport layer are each preferably 500 nm or less in terms of reducing drive voltage.

The thickness of the hole-transport layer is preferably 1 nm to 500 nm, more preferably 5 nm to 200 nm, still more preferably 10 nm to 100 nm. The thickness of the hole-injection layer is preferably 0.1 nm to 200 nm, more preferably 0.5 nm to 100 nm, still more preferably 1 nm to 100 nm.

Each of the hole-injection layer and the hole-transport layer may have a single-layered structure made of one or more of the above-mentioned materials, or a multi-layered structure made of a plurality of layers which are identical or different in composition.

<<<Electron-Injection Layer and Electron-Transport Layer>>>

The electron-injection layer and the electron-transport layer are layers having the functions of receiving electrons from the cathode or the cathode side and transporting the electrons to the anode side. The electron-injection materials or electron-transport materials for these layers may be low-molecular-weight or high-molecular-weight compounds.

Specific examples thereof include pyridine derivatives, quinoline derivatives, pyrimidine derivatives, pyrazine derivatives, phthalazine derivatives, phenanthoroline derivatives, triazine derivatives, triazole derivatives, oxazole derivatives, oxadiazole derivatives, imidazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyradine derivatives, aryl tetracarboxylic anhydrides such as perylene and naphthalene, phthalocyanine derivatives, metal complexes (e.g., metal complexes of 8-quinolinol derivatives, metal phthalocyanine, and metal complexes containing benzoxazole or benzothiazole as the ligand) and organic silane derivatives (e.g., silole).

The electron-injection layer or the electron-transport layer in the organic EL device of the present invention may contain an electron donating dopant. The electron donating dopant to be introduced in the electron-injection layer or the electron-transport layer may be any material, so long as it has an electron-donating property and a property for reducing an organic compound. Preferred examples thereof include alkali metals (e.g., Li), alkaline earth metals (e.g., Mg), transition metals including rare-earth metals, and reducing organic compounds. Among the metals, those having a work function of 4.2 eV or less are particularly preferably used. Examples thereof include Li, Na, K, Be, Mg, Ca, Sr, Ba, Y, Cs, La, Sm, Gd and Yb. Also, examples of the reducing organic compounds include nitrogen-containing compounds, sulfur-containing compounds and phosphorus-containing compounds.

In addition, there may be used materials described in, for example, JP-A Nos. 06-212153, 2000-196140, 2003-68468, 2003-229278 and 2004-342614.

These electron donating dopants may be used alone or in combination. The amount of the electron donating dopant used depends on the type of the material, but it is preferably 0.1% by mass to 99% by mass, more preferably 1.0% by mass to 80% by mass, particularly preferably 2.0% by mass to 70% by mass, with respect to the amount of the material of the electron transport layer.

The thicknesses of the electron-injection layer and the electron-transport layer are each preferably 500 nm or less in terms of reducing drive voltage.

The thickness of the electron-transport layer is preferably 1 nm to 500 nm, more preferably 5 nm to 200 nm, particularly preferably 10 nm to 100 nm. The thickness of the electron-injection layer is preferably 0.1 nm to 200 nm, more preferably 0.2 nm to 100 nm, particularly preferably 0.5 nm to 50 nm.

Each of the electron-injection layer and the electron-transport layer may have a single-layered structure made of one or more of the above-mentioned materials, or a multi-layered structure made of a plurality of layers which are identical or different in composition.

<<<Hole Blocking Layer>>>

The hole blocking layer is a layer having the function of preventing the holes, which have been transported from the anode side to the light-emitting layer, from passing toward the cathode side, and may be provided as an organic compound layer adjacent to the light-emitting layer on the cathode side.

Examples of the compound forming the hole blocking layer include aluminum complexes (e.g., bis-(2-methyl-8-quinolinolate)-4-(phenylphenolate)aluminum (BAlq)), triazole derivatives and phenanthroline derivatives (e.g., BCP).

The thickness of the hole blocking layer is preferably 1 nm to 500 nm, more preferably 5 nm to 200 nm, particularly preferably 10 nm to 100 nm.

The hole blocking layer may have a single-layered structure made of one or more of the above-mentioned materials, or a multi-layered structure made of a plurality of layers which are identical or different in composition.

<<<Electron Blocking Layer>>>

An electron blocking layer is a layer having the function of preventing the electrons, which have been transported from the cathode side to the light-emitting layer, from passing toward the anode side, and may be provided as an organic compound layer adjacent to the light-emitting layer on the anode side in the present invention.

Examples of the compound forming the electron blocking layer include those listed as a hole-transport material.

The thickness of the electron blocking layer is preferably 1 nm to 500 nm, more preferably 5 nm to 200 nm, particularly preferably 10 nm to 100 nm.

The electron blocking layer may have a single-layered structure made of one or more of the above-mentioned materials, or a multi-layered structure made of a plurality of layers which are identical or different in composition.

<<Driving>>

The organic EL layer can emit light when a DC voltage (which, if necessary, contains AC components) (generally 2 volts to 15 volts) or a DC is applied to between the anode and the cathode.

For the driving method of the organic EL layer, applicable are those described in, for example, JP-A Nos. 02-148687, 06-301355, 05-29080, 07-134558, 08-234685 and 08-241047, Japanese Patent No. 2784615, and U.S. Pat. Nos. 5,828,429 and 6,023,308.

In the organic EL device, the light-extraction efficiency can be further improved by various known methods. It is possible to increase the light-extraction efficiency to improve the external quantum efficiency, for example, by processing the surface shape of the substrate (for example, by forming a fine concavo-convex pattern), by controlling the refractive index of the substrate, the ITO layer and/or the organic layer, or by controlling the thickness of the substrate, the ITO layer and/or the organic layer.

The organic EL layer may be used in a so-called top-emission configuration in which light is extracted from the anode side.

The organic EL layer may have the configuration in which charge-generation layers are provided between a plurality of light-emitting layers for the purpose of further enhancing the light-emission efficiency.

The charge-generation layer has the function of generating charges (holes and electrons) during application of an electric field as well as the function of injecting the generated charges into the adjacent layer to the charge-generation layer.

The charge-generation layer is made of any material, so long as it has the above-described functions. Also, it may be made of a single compound or a plurality of compounds.

Specifically, the material/compound may be conductive materials, semi-conductive materials (like doped organic layers) or insulating materials. Specific examples thereof include those disclosed in, for example, JP-A Nos. 11-329748, 2003-272860 and 2004-39617.

More specific examples thereof include transparent conductive materials such as ITO and indium zinc oxide (IZO); fullerenes such as $C_{60}$; conductive organic compounds such as thiophene oligomers; conductive organic compounds such as metal phthalocyanines, metal-free phthalocyanines, metal porphyrins and metal-free porphyrins; metal materials such as Ca, Ag, Al, Mg—Ag alloy, Al—Li alloy and Mg—Li alloy; hole conductive materials; conductive materials; and mixtures thereof.

Examples of the hole conductive material include hole transport organic materials (e.g., 2-TNATA and NPD) doped with oxidants having electron attracting properties (e.g., F4-TCNQ, TCNQ and $FeCl_3$), P-type conductive polymers and P-type semiconductors. Examples of the conductive material include the electron transport organic materials doped with metals or metal compounds having a work function of less than 4.0 eV, N-type conductive polymers and N-type semiconductors. Examples of the N-type semiconductor include N-type Si, N-type CdS and N-type ZnS. Examples of the P-type semiconductor include P-type Si, P-type CdTe and P-type CuO.

Further, the charge-generation layer may use an insulating material such as $V_2O_5$.

The electric charge-generation layer may have a single-layered structure or be a laminate of a plurality of layers. Examples of the laminate include laminates of hole or electron conductive material and conductive materials (e.g., a transparent conductive material and a metal material); and a laminate of the hole and electron conductive materials.

In general, preferably, the film thickness or the material of the charge-generation layer can be selected so that the transmittance with respect to a visible light is 50% or more. The film thickness is not particularly limited and may be appropriately determined depending on the purpose. It is preferably 0.5 nm to 200 nm, more preferably 1 nm to 100 nm, still more preferably 3 nm to 50 nm, particularly preferably 5 nm to 30 nm.

The method for forming the charge-generation layer is not particularly limited, and the above-described method for forming the organic compound layer can also be employed.

The charge-generation layer is formed between two or more of the light-emitting layer. Also, a material having the function of injecting charges may be incorporated into the adjacent layers to the charge-generation layer on the anode and cathode sides. In order to increase injection properties of electrons into the adjacent layers on the anode side, electron-injecting compounds such as BaO, SrO, $Li_2O$, LiCl, LiF, $MgF_2$, MgO and $CaF_2$ may be laminated on a surface of the charge-generation layer which faces the anode.

Other than the materials described above, the material for the charge-generation layer may be selected based on the description in, for examples, JP-A No. 2003-45676 and U.S. Pat. Nos. 6,337,492, 6,107,734 and 6,872,472.

The organic EL layer may have a resonator structure. For example, on a transparent substrate are stacked a multi-layered film mirror composed of a plurality of laminated films having different reflective indices, a transparent or semi-transparent electrode, a light-emitting layer and a metal electrode. The light generated in the light-emitting layer is repeatedly reflected between the multi-layered film mirror and the metal electrode (which serve as reflection plates); i.e., is resonated.

In another preferred embodiment, a transparent or semi-transparent electrode and a metal electrode are stacked on a transparent substrate. In this structure, the light generated in the light-emitting layer is repeatedly reflected between the transparent or semi-transparent electrode and the metal electrode (which serve as reflection plates); i.e., is resonated.

For forming the resonance structure, an optical path length determined based on the effective refractive index of two reflection plates, and on the refractive index and the thickness of each of the layers between the reflection plates is adjusted to be an optimal value for obtaining a desired resonance wavelength. The calculation formula applied in the case of the first embodiment is described in JP-A No. 09-180883. The calculation formula in the case of the second embodiment is described in JP-A No. 2004-127795.

EXAMPLES

The present invention will next be described by way of examples, which should not be construed as limiting the present invention thereto.

Example 1

A light-emitting device of Example 1 was fabricated as follows.
<Formation of Fine Concavo-Convex Pattern>
Through the below procedure, a fine concavo-convex pattern was formed and then provided with a reflective layer over the front surface thereof.
<<Fine Concavo-Convex Portions>>
A thin film was formed on a glass substrate using compound A given below; i.e., an ionically-bonded compound of the upper and lower compounds (compound A has a high refractive index: $n_4$=1.73 with respect to light having a wavelength of 550 nm (main light-emitting wavelength)).

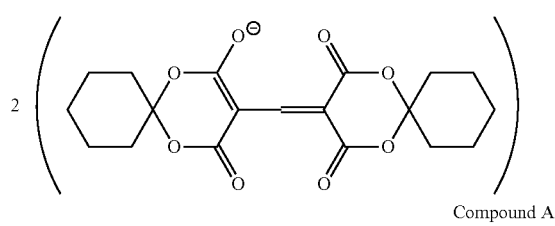

Compound A

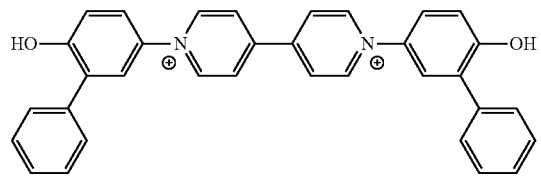

A material made of compound A (35 mg) was dissolved in tetrafluoropropanol (1 mL). The resultant solution was dropped on the glass substrate which was being rotated at 300 rpm. Then, the rotation speed was increased to 1,000 rpm, whereby a 200 nm-thick thin film was formed.

The thin film was treated using a fine processing device (NEO1000, product of Pulstec Industrial Co., Ltd.) to form a fine concavo-convex pattern having a pitch interval of 0.6λ.

<<Reflective Layer>>

Through DC sputtering, a 100 nm-thick Ag thin film was formed on the fine concavo-convex pattern as a reflective layer.

<Formation of Intermediate Layer>

A material made of compound A (70 mg) was dissolved in tetrafluoropropanol (1 mL). The resultant solution was dropped on the fine concavo-convex pattern-formed glass substrate which was being rotated at 300 rpm. Then, the rotation speed was increased to 1,000 rpm, whereby a 400 nm-thick thin film was formed.

Here, the intermediate layer was formed so that the intermediate layer's refractive index $n_4$ was the same as the light-emitting portion's refractive index $n_3$ with respect to light having a main light-emitting wavelength.

<Formation of Organic EL Layer (Light-Emitting Portion)>

An organic EL device was formed using a resistance heating vacuum deposition apparatus.

A 70 nm-thick ITO (indium tin oxide) layer was formed on the intermediate layer as an anode.

A 160 nm-thick hole-injection layer was formed on the ITO layer by co-evaporating 4,4',4''-tris(2-naphthylphenylamino)triphenylamine (which is abbreviated as "2-TNATA," refer to the following structural formula) and tetrafluorotetracyanoquinodimethane (which is abbreviated as "F4-TCNQ," refer to the following structural formula) so that the amount of F4-TCNQ was 1.0% by mass with respect to 2-TNATA.

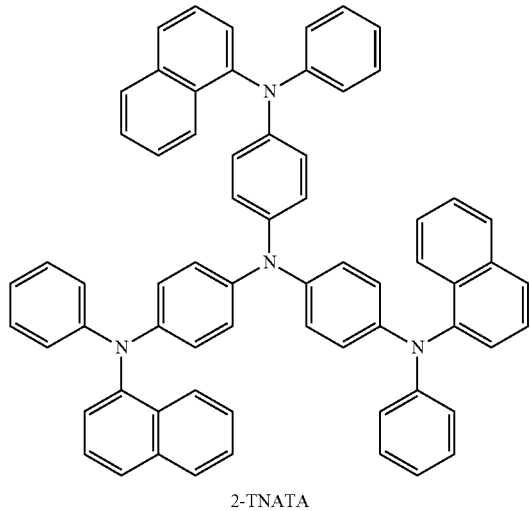

2-TNATA

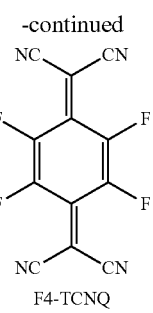

F4-TCNQ

A 10 nm-thick hole-transport layer was formed on the hole injection layer using N,N'-dinaphthyl-N,N'-diphenyl-[1,1'-biphenyl]-4,4'-diamine (which is abbreviated as "α-NPD," refer to the following structural formula).

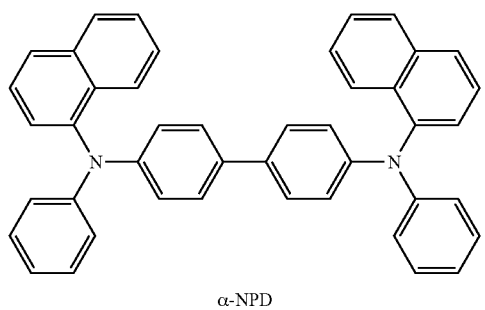 [SMILES: c1ccc(N(c2ccc(-c3ccc(N(c4ccccc4)c4cccc5ccccc45)cc3)cc2)c2cccc3ccccc23)cc1]

α-NPD

A 30 nm-thick organic light-emitting layer was formed on the hole transport layer by co-evaporating 1,3-bis(carbazol-9-yl)benzene (which is abbreviated as "mCP," refer to the following structural formula) and green light-emitting material tris(2-phenylpyridine)iridium (which is abbreviated as "Ir(ppy)₃," refer to the following structural formula) so that the amount of the green light-emitting material was 5% by mass with respect to mCP.

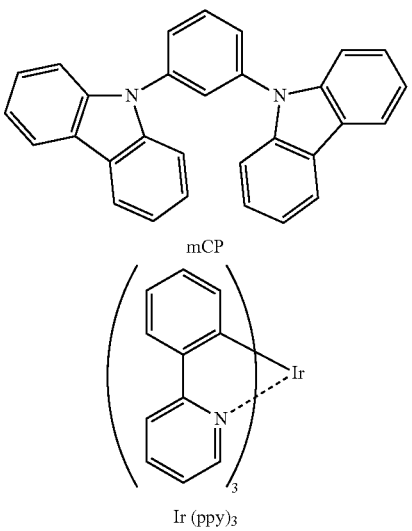

mCP

Ir(ppy)₃

Subsequently, a 40 nm-thick electron transport layer was formed on the organic light-emitting layer using bis-(2-methyl-8-quinolinolate)-4-(phenylphenolate)aluminum (which is abbreviated as "BAlq," refer to the following structural formula).

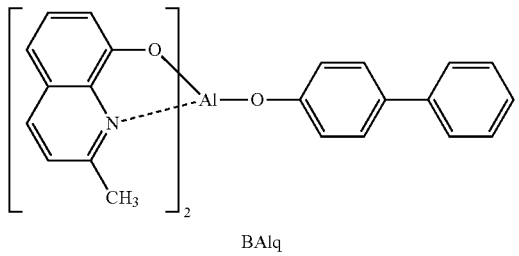

BAlq

Further, patterning was performed using a shadow mask to form a 1 nm-thick LiF layer, a 2 nm-thick Al layer and a 100 nm-thick ITO layer.
<Seal Layer>
A seal layer was formed on the organic EL layer using a mixture of $SiN_x$ and $SiO_x$. The seal layer was found to have a refractive index of about 1.8.

Example 2

The procedure of Example 1 was repeated, except that the intermediate layer was formed so that the refractive index $n_4$ was the same as $0.96n_3$ rather than $n_3$, to thereby fabricate a light-emitting device of Example 2.

Example 3

The procedure of Example 1 was repeated, except that the intermediate layer was formed so that the refractive index $n_4$ was the same as $0.92n_3$ rather than $n_3$, to thereby fabricate a light-emitting device of Example 3.

Example 4

The procedure of Example 1 was repeated, except that the intermediate layer was formed so that the refractive index $n_4$ was the same as $0.9n_3$ rather than $n_3$, to thereby fabricate a light-emitting device of Example 4.

Example 5

The procedure of Example 1 was repeated, except that the intermediate layer was formed so that the refractive index $n_4$ was the same as $1.1n_3$ rather than $n_3$, to thereby fabricate a light-emitting device of Example 5.

Example 6

The procedure of Example 1 was repeated, except that a fine concavo-convex pattern was formed so that the pitch interval was $0.15\lambda$ rather than $0.6\lambda$, to thereby fabricate a light-emitting device of Example 6.

Example 7

The procedure of Example 1 was repeated, except that a fine concavo-convex pattern was formed so that the pitch interval was $105\lambda$ rather than $0.6\lambda$, to thereby fabricate a light-emitting device of Example 7.

Comparative Example 1

The procedure of Example 1 was repeated, except that the intermediate layer was formed so that the refractive index $n_4$ was the same as $0.85n_3$ rather than $n_3$, to thereby fabricate a light-emitting device of Comparative Example 1.

Comparative Example 2

The procedure of Example 1 was repeated, except that the intermediate layer was formed so that the refractive index $n_4$ was the same as $1.15n_3$ rather than $n_3$, to thereby fabricate a light-emitting device of Comparative Example 2.
<Measuring Method>
<<Refractive Index>>
The refractive index of the organic EL layer (light-emitting portion), the intermediate layer or the seal layer was measured with an ellipsometry method.
<<Pitch Interval of Fine Concavo-Convex Pattern>>
The pitch interval of the fine concavo-convex pattern was measured with an AFM (product name: OLS3500, product of OLYMPUS CORPORATION).
<<Light Quantity>>
The light emitted from the fabricated light-emitting device was measured with a multichannel spectrometer (product of Ocean Photonics, Inc.).
Notably, the main light-emitting wavelength of the light emitted from the EL layer (light-emitting portion) was measured with a multichannel spectrometer (product of Ocean Photonics, Inc.).
<Evaluation of Light-Extraction Efficiency>
Each of the fabricated light-emitting devices was evaluated for light-extraction efficiency as follows.
The light-extraction efficiency was evaluated based on the ratio $Q_2/Q_1$, where $Q_1$ denotes a light quantity of a light-emitting device having no fine concavo-convex pattern (i.e., this value being regarded as 1) and $Q_2$ denotes a light quantity of each of the fabricated light-emitting devices of Examples 1 to 7 and Comparative Examples 1 and 2. The results are shown in Table 1.

TABLE 1

| | Refractive index of intermediate layer (×$n_3$) | Pitch interval of fine pattern (×$\lambda$) | Light-extraction efficiency |
|---|---|---|---|
| Ex. 1 | 1.00 | 0.6 | 1.30 |
| Ex. 2 | 0.96 | 0.6 | 1.25 |
| Ex. 3 | 0.92 | 0.6 | 1.20 |
| Ex. 4 | 0.90 | 0.6 | 1.15 |
| Ex. 5 | 1.10 | 0.6 | 1.15 |
| Ex. 6 | 1.00 | 0.15 | 1.20 |
| Ex. 7 | 1.00 | 105 | 1.05 |
| Comp. Ex. 1 | 0.85 | 0.6 | 0.90 |
| Comp. Ex. 2 | 1.15 | 0.6 | 1.00 |

INDUSTRIAL APPLICABILITY

The light-emitting device of the present invention can be suitably used in, for example, display devices, displays (light-emitting-type flat panel displays (organic EL, inorganic EL, plasma)), backlights, electrophotography, illuminating light sources, recording light sources, exposing light sources, reading light sources, markers, interior accessories, optical communication, LEDs and fluorescent tubes.

The invention claimed is:
1. A light-emitting device comprising, in the order mentioned:
a light-emitting layer containing a plurality of light-emitting portions,
an intermediate layer, a reflective layer, and a fine concavo-convex pattern, the fine concavo-convex pattern comprises a reflective material, wherein the intermediate layer is disposed over a planar second surface of the light-emitting layer which surface is opposite to a first surface of the light-emitting layer, wherein the fine concavo-convex pattern has a cross-sectional shape which has portions projected and recessed with respect to the planar second surface of the light-emitting layer and the reflective layer is disposed between the intermediate layer and fine concavo-convex pattern and reflects light emitted from the light-emitting layer, and wherein at least part of the intermediate layer has a refractive index of 0.9n to 1.1n, where n denotes a refractive index of the light-emitting portion with respect to light which has a main light-emitting wavelength.

2. The light-emitting device according to claim 1, wherein the fine concavo-convex pattern has a pitch interval of 0.01λ to 100λ, where λ denotes a main light-emitting wavelength of light emitted from the light-emitting layer.

3. The light-emitting device according to claim 1, wherein the light-emitting layer contains two or more light-emitting portions.

4. The light-emitting device according to claim 1, wherein the fine concavo-convex pattern is made of heat-mode resist.

5. The light-emitting device according to claim 1, wherein the reflective layer has a thickness of 10 nm to 10,000 nm.

6. The light-emitting device according to claim 1, wherein the intermediate layer has a refractive index of 1.55 to 3.0.

7. The light-emitting device according to claim 1, wherein the fine concavo-convex pattern has a pitch interval of 50 nm to 10 μm.

8. The light-emitting device according to claim 1, wherein the light-emitting layer further comprises a seal layer for sealing the light-emitting portions, and wherein a material of the seal layer is any of an acrylic resin, an epoxy resin, a fluorine-containing resin, a silicone resin, a rubber resin and an ester resin.

9. A production method for a light-emitting device, comprising:

forming a light-emitting layer containing a light-emitting portion, forming an intermediate layer over a planar second surface of the light-emitting layer which surface is opposite to a first surface of the light-emitting layer, and forming, over the intermediate layer, a fine concavo-convex pattern comprising a reflective material and having a cross-sectional shape which has portions projected and recessed with respect to the planar second surface of the light-emitting layer, and a reflective layer is disposed between the fine concavo-convex pattern and intermediate layer for reflecting light emitted from the light-emitting layer, wherein the fine concavo-convex pattern is formed through heat-mode lithography, wherein the light-emitting device comprises, in the order mentioned: the light-emitting layer containing the light-emitting portion, the intermediate layer, and the fine concavo-convex pattern, wherein the intermediate layer is disposed over the second surface of the light-emitting layer which surface is opposite to the first surface of the light-emitting layer, wherein the fine concavo-convex pattern has the cross-sectional shape which has the portions projected and recessed with respect to the light-emitting layer and reflects the light emitted from the light-emitting layer, and wherein at least part of the intermediate layer has a refractive index of 0.9n to 1.1n, where n denotes a refractive index of the light-emitting portion with respect to light which has a main light-emitting wavelength.

10. The production method according to claim 9, wherein the fine concavo-convex pattern has a pitch interval of 0.01λ to 100λ, where λ denotes a main light-emitting wavelength of light emitted from the light-emitting layer.

11. The production method according to claim 9, wherein the intermediate layer has a refractive index of 1.55 to 3.0.

12. The production method according to claim 9, wherein the fine concavo-convex pattern has a pitch interval of 50 nm to 10 μm.

13. A display comprising:

a light-emitting device which comprises, in the order mentioned:

a light-emitting layer containing a light-emitting portion, an intermediate layer, a reflective layer, a fine concavo-convex pattern comprising a reflective material, and wherein the intermediate layer is disposed over a planar second surface of the light-emitting layer which surface is opposite to a first surface of the light-emitting layer, wherein the fine concavo-convex pattern has a cross-sectional shape which has portions projected and recessed with respect to the planar second surface of the light-emitting layer and the reflective layer is disposed between the intermediate layer and fine concavo-convex pattern and reflects light emitted from the light-emitting layer, and wherein at least part of the intermediate layer has a refractive index of 0.9n to 1.1n, where n denotes a refractive index of the light-emitting portion with respect to light which has a main light-emitting wavelength.

14. The display according to claim 13, wherein the fine concavo-convex pattern has a pitch interval of 0.01λ to 100λ, where λ denotes a main light-emitting wavelength of light emitted from the light-emitting layer.

15. The display according to claim 13, wherein the intermediate layer has a refractive index of 1.55 to 3.0.

16. The display according to claim 13, wherein the fine concavo-convex pattern has a pitch interval of 50 nm to 10 μm.

* * * * *